(12) United States Patent
Jhy-Jyi et al.

(10) Patent No.: US 10,468,448 B2
(45) Date of Patent: Nov. 5, 2019

(54) SEMICONDUCTOR IMAGE SENSOR AND METHOD FOR FORMING THE SAME

(71) Applicant: TAIWAN SEMICONDUCTOR MANUFACTURING COMPANY LTD., Hsinchu (TW)

(72) Inventors: Sze Jhy-Jyi, Hsin-Chu (TW); Yimin Huang, Hsinchu (TW); Dun-Nian Yaung, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/918,232

(22) Filed: Mar. 12, 2018

(65) Prior Publication Data

US 2019/0165025 A1  May 30, 2019

Related U.S. Application Data

(60) Provisional application No. 62/592,996, filed on Nov. 30, 2017.

(51) Int. Cl.
*H01L 27/146* (2006.01)
*H04N 5/33* (2006.01)

(52) U.S. Cl.
CPC .... *H01L 27/14629* (2013.01); *H01L 27/1469* (2013.01); *H01L 27/14621* (2013.01);
(Continued)

(58) Field of Classification Search
CPC ............... H01L 27/146; H01L 27/1464; H01L 27/14629; H01L 27/14627; H01L 27/1469;
(Continued)

(56) References Cited

U.S. PATENT DOCUMENTS 9,818,791 B1 * 11/2017 Mao ................. H01L 27/14621
2010/0026865 A1    2/2010 Tivarus et al.
(Continued)

FOREIGN PATENT DOCUMENTS

| TW | 201013910 A | 4/2010 |
| TW | 201316502 A | 4/2013 |
| TW | 201545328 A | 12/2015 |

OTHER PUBLICATIONS

Office Action and Search Report dated Sep. 18, 2018 issued by Taiwan Intellectual Property Office for counterpart application 106142604.
(Continued)

*Primary Examiner* — Galina G Yushina
(74) *Attorney, Agent, or Firm* — WPAT, P.C., Intellectual Property Attorneys; Anthony King

(57) ABSTRACT

A semiconductor image sensor includes a first substrate including a first front side and a first back side, a first interconnect structure disposed over the first front side of the first substrate, a second substrate including a second front side and a second back side, a second interconnect structure disposed over the second front side of the second substrate, a third substrate including a third front side and a third back side, and a third interconnect structure disposed over the third front side of the third substrate. The first substrate includes a plurality of first sensing devices, and the second substrate includes a plurality of second sensing devices. The second back side of the second substrate faces the first front side of the first substrate, and the second front side of the second substrate faces the third front side of the third substrate.

20 Claims, 13 Drawing Sheets

(52) U.S. Cl.
CPC .. *H01L 27/14627* (2013.01); *H01L 27/14634* (2013.01); *H01L 27/14636* (2013.01); *H01L 27/14645* (2013.01); *H01L 27/14649* (2013.01); *H04N 5/332* (2013.01)

(58) Field of Classification Search
CPC ......... H01L 27/14634; H01L 27/14649; H01L 27/14645
See application file for complete search history.

(56) References Cited

U.S. PATENT DOCUMENTS

| | | | |
|---|---|---|---|
| 2010/0118172 A1* | 5/2010 | McCarten | H01L 27/14621 348/302 |
| 2011/0139234 A1* | 6/2011 | Iizuka | G02B 5/18 136/256 |
| 2012/0249454 A1 | 10/2012 | Teraguchi et al. | |
| 2013/0075607 A1 | 3/2013 | Bikumandla et al. | |
| 2015/0054962 A1* | 2/2015 | Borthakur | H04N 5/332 348/164 |
| 2015/0340391 A1 | 11/2015 | Webster | |
| 2017/0221948 A1* | 8/2017 | Crocherie | H01L 27/14621 |
| 2017/0237911 A1 | 8/2017 | Won | |
| 2017/0278826 A1* | 9/2017 | Sugizaki | G02B 5/20 |

OTHER PUBLICATIONS

English Abstract Translation of Office Action and Search Report issued by Taiwan Intellectual Property Office for counterpart application 106142604.

Office Action and Search Report dated Apr. 15, 2019 issued by Taiwan Intellectual Property Office for counterpart application No. 107121740, No translation of the foreign document was provided. Foreign Patent Document TW201013910A is a family patent to US Patent Publication US2010026865A1.

Foreign Patent Document TW201316502A is a family patent to US Patent Publication US2013075607A1.

Foreign Patent Document TW201545328A is a family patent to US Patent Publication US2015340391A1.

* cited by examiner

SEMICONDUCTOR IMAGE SENSOR AND METHOD FOR FORMING THE SAME

PRIORITY DATA

This patent claims the benefit of U.S. Provisional Patent Application Ser. No. 62/592,996 filed Nov. 30, 2017, the entire disclosure of which is hereby incorporated by reference.

BACKGROUND

Digital cameras and other imaging devices employ images sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
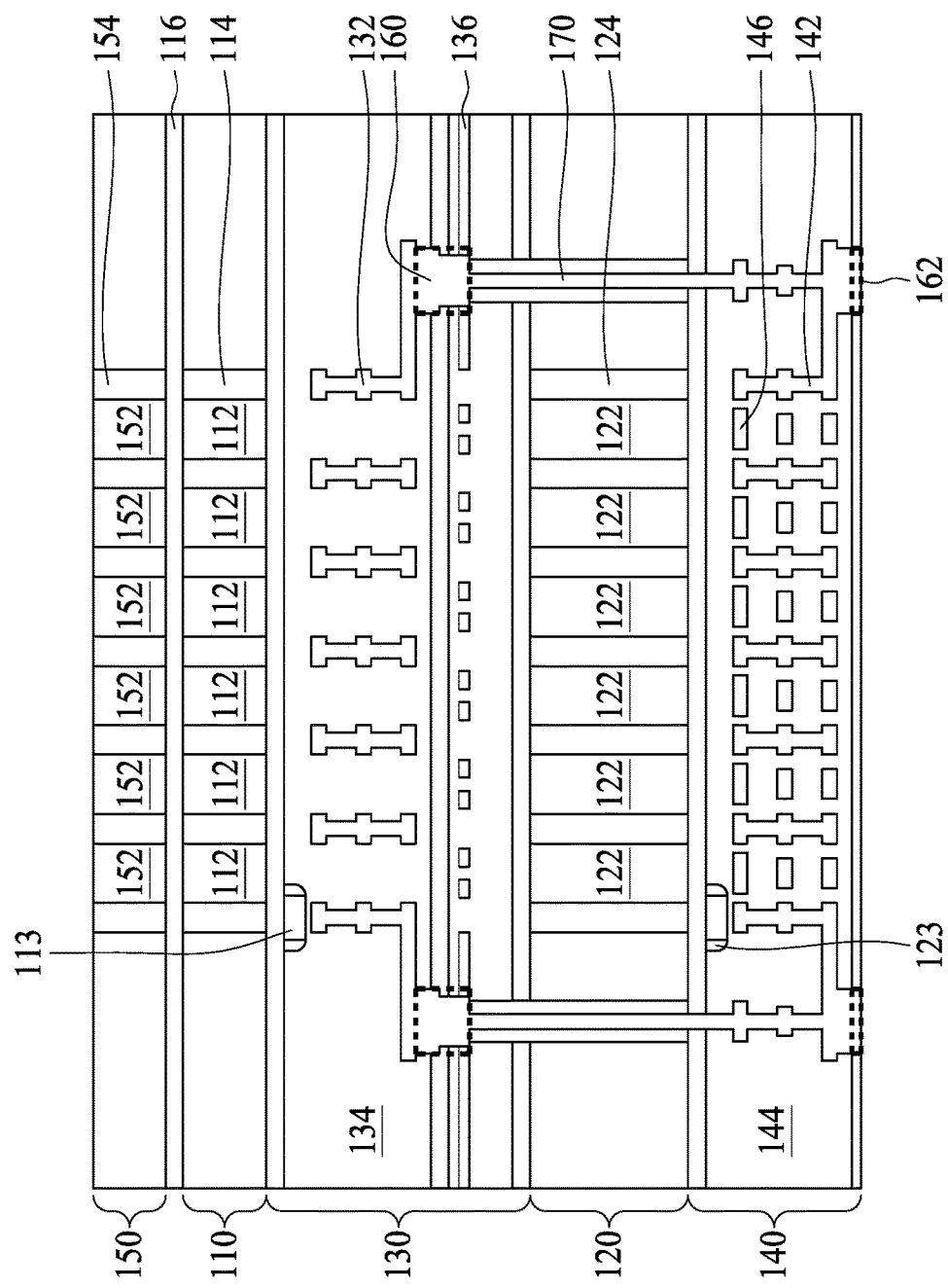
FIG. 1 is a schematic drawing illustrating a semiconductor image sensor according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first". "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±13%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Semiconductor image sensor includes an array of pixel sensors. Typically, the pixel sensors are configured to receive electromagnetic radiation and convert the electromagnetic radiation into electrical charges. For the most part, electromagnetic radiation sensed in an outdoor or indoor scene in the visible, near infrared (NIR) and shortwave infrared (SWIR) spectrums results from reflection. In some embodiments, different pixel sensors are therefore provided for different spectrums. For example, image sensing devices are provided to receive the visible light and to capture an image of an object, while depth sensing devices are provided to receive IR and/or NIR to determine a distance between an image sensor and the object. A Composite pixel including the different sensing devices to determine the distance to the object and capture the image of the object is constructed in some embodiments. However, it is still in need to obtain same resolution for both visible and NIR electromagnetic radiation. Further, prevention of polluted IR or NIR signals due to long-wavelength visible light and IR or NIR background cancellation capability to prevent color fidelity loss in visible imaging are both required.

The present disclosure therefore provides a semiconductor image sensor including integrated visible light sensing devices and IR/NIR sensing devices. In some embodiments, the visible light sensing devices and the IR/NIR sensing devices of the semiconductor image sensor includes same resolutions. Further, NIR signal loss and visible light pollution are both reduced while the IR/NIR cancellation capability is improved in some embodiments. The present disclosure further provides a method for forming the semiconductor image sensor that is able to simplify back-end-of-line (BEOL) routing and improve integration of the visible light sensing devices and IR/NIR sensing devices.

FIG. 1 is a cross-sectional view of a semiconductor image sensor 100 according to aspects of the present disclosure in some embodiments. In some embodiments, the semiconductor image sensor 100 includes a light sensing layer 110, and the light sensing layer 110 can be a bulk semiconductor substrate such as a bulk silicon (Si) substrate, or a silicon-on-insulator (SOI) substrate, but the disclosure is not limited to this. The light sensing layer 110 can include a plurality of sensing devices 112 arranged in rows and columns, and configured to accumulate charge (e.g. electrons) from photons incident thereon. Further, at least one logic device 113, such as a transistor, can be configured to enable readout of the sensing devices 112. The sensing devices 112 are disposed to receive light with a predetermined wavelength. In some embodiments, the sensing devices 112 can be operated to sense visible light of incident light. The semiconductor image sensor 100 includes another light sensing layer 120 including a plurality of sensing devices 122. In some embodiments, the sensing devices 122 are different from the sensing devices 112. As mentioned above, at least one logic device 123, such as a transistor, can be configured to enable readout of the sensing devices 122. The sensing devices 122 are disposed to receive light with a predetermined wavelength. In some embodiments, the sensing devices 122 can be operated to sense infrared (IR) and/or near-infrared (NIR) of the incident light. In some embodiments, each of the sensing devices 112 is aligned with one of the sensing devices 122. Further, the light sensing layer 120 is between the logic device 113 and the logic device 123, as shown in FIG. 1.

In some embodiments, a plurality of isolation structures 114 such as deep trench isolation (DTI) structures is disposed in the light sensing layer 110, and a plurality of isolation structure 124 such as DTI structures is disposed in the light sensing layer 120, as shown in FIG. 1. In some embodiments, each of the isolation structures 114 and each of the isolation structures 124 can include an insulating material coated by a coating (not shown). The coating may include a metal such as tungsten (W), copper (Cu), or aluminum-copper (AlCu), or a low-n material, which has a refractive index (n) less than Si. The low-n material can include silicon oxide (SiO) or hafnium oxide (HfO), but the disclosure is not limited thereto. In some embodiments, the insulating material can include the low-n insulating material, but the disclosure is not limited thereto. In some embodiment, the isolation structures 114 surrounding and between the sensing devices 112 provide optical isolation between neighboring sensing devices 112, thereby serving as a substrate isolation grid and reducing cross-talk. Similarly, the isolation structures 124 surrounding and between the sensing devices 122 provide optical isolation between neighboring sensing devices 122, thereby serving as a substrate isolation grid and reducing cross-talk.

Referring to FIG. 1, in some embodiments, an optical layer 150 including a plurality of color filters 152 corresponding to the sensing devices 112 is disposed over the light sensing layer 110. In some embodiments, a passivation layer 116 can be disposed between the optical layer 150 and the light sensing layer 110, but the disclosure is not limited thereto. In some embodiments, the optical layer 150 further includes a plurality of low-n structures 154 disposed between the color filters 152. The low-n structures 154 form a grid structure and the color filters 152 are located within the grid. Thus the low-n structure 154 surrounds each color filter 152, and separates the color filters 152 from each other as shown in FIG. 1. The low-n structure 154 can be a composite structure including layers with a refractive index less than the refractive index of the color filters 152. In some embodiments, the low-n structure 154 can include a composite stack including at least a metal layer and a dielectric layer disposed over the metal layer. In some embodiments, the metal layer can include W, Cu, or AlCu. The dielectric layer includes a material with a refractive index less than the refractive index of the color filters 152 or a material with a refractive index less than a refractive index of Si, but the disclosure is not limited thereto. Due to the low refractive index, the low-n structure 154 serves as a light guide to direct or reflect light to the color filters 152. Consequently, the low-n structure 154 effectively increases the amount of the light incident into the color filters 152. Further, due to the low refractive index, the low-n structure 154 provides optical isolation between neighboring color filters 152. In some embodiments, the optical layer 150 further includes a plurality of micro-lenses (not shown) disposed over the color filters 152. The micro-lenses are used to focus incident light onto the corresponding sensing devices 112. It should be easily understood that locations and areas of each micro-lens correspond to those of the color filters 152 or those of the sensing devices 112.

In some embodiments, the color filters 152 respectively allow a predefined spectrum of incoming electromagnetic radiation to pass. In other words, the color filters 152 are assigned to corresponding colors or wavelengths of lights, and configured to filter out all but the assigned colors or wavelengths of lights. For example, the color filters 152 assignments alternate between red, green, and blue lights, such that the color filters 152 include red color filters, green color filters and blue color filters. In some embodiments, the red color filters, the green color filters and the blue color filters are arranged in a Bayer mosaic pattern, but the disclosure is not limited thereto. Accordingly, in some embodiments, the optical layer 150 including the micro-lenses and the color filters 152, and the light sensing layer 110 construct a RGB image sensing system, and the sensing devices 112 may be respectively a red image sensing device, a green image sensing device, and a blue image sensing device, but the disclosure is not limited thereto.

Still referring to FIG. 1, the semiconductor structure 100 further includes a connecting layer 130. In some embodiments, the connecting layer 130 includes an interconnect structure 132 sandwiched between the light sensing layer 110 and the light sensing layer 120. And the logic device 113 is disposed between the light sensing layer 110 and the interconnect structure 132. In some embodiments, the interconnect structure 132 includes a plurality of BEOL metallization layer stacked in an interlayer dielectric (ILD) layer 134. One or more contacts of the interconnect structure 132 are electrically connected to the logic device 113 disposed over the light sensing layer 110. In some embodiments, the ILD layer 134 can include a low-k dielectric material (i.e., a dielectric material with a dielectric constant less than 3.9) or an oxide, but the disclosure is not limited thereto. The interconnect structure 132 may include a metal such as Cu, W, or Al, but the disclosure is not limited thereto.

The semiconductor image sensor 100 further includes another connecting layer 140. In some embodiments, the connecting layer 140 includes an interconnect structure 142. As shown in FIG. 1, the light sensing layer 120 is sandwiched between the interconnect structure 132 and the interconnect structure 142. And the logic device 123 is disposed between the light sensing layer 120 and the interconnect structure 142. In some embodiments, the interconnect structure 142 includes a plurality of BEOL metallization layers stacked in an ILD layer 144. One or more contacts of the interconnect structure 142 are electrically connected to the logic device 123 disposed over the light sensing layer 120. In some embodiments, the ILD layer 144 can include a low-k dielectric material or an oxide, but the disclosure is not limited thereto. The interconnect structure 142 may include a metal such as Cu, W, or Al, but the disclosure is not limited thereto. In some embodiments, another substrate (not shown) can be configured to electrically connected to the interconnect structure 142, but the disclosure is not limited thereto. In some embodiments, the semiconductor image sensor 100 further includes a plurality of conductive reflectors 146 disposed in the ILD layer 144 of the connecting layer 140. In some embodiments, the conductive reflectors 146 are disposed in the connecting layer 140 proximal to the light sensing layer 120, but the disclosure is not limited thereto. In some embodiments, each of the conductive reflectors 146 respectively corresponds to one of the sensing devices 122, but the disclosure is not limited thereto. In some embodiments, the conductive reflectors 146 can be physically and electrically isolated from the interconnect structure 142.

In some embodiments, the semiconductor image sensor 100 includes at least one bonded structure 160 disposed between the entire interconnect structure 132 and the light sensing layer 120. Further, the semiconductor image sensor 100 includes at least one bonded structure 162 electrically connected to the second interconnect structure 142. Accordingly, another substrate (not shown) can be configured to electrically connected to the interconnect structure 142 through the bonded structure 162, but the disclosure is not limited thereto. In some embodiments, the semiconductor image sensor 100 further includes at least one conductor 170 penetrating a portion of the connecting layer 130 and the light sensing layer 120. More importantly, the conductor 170 electrically connects the bonded structure 160 and the second interconnect structure 142, as shown in FIG. 1. Accordingly, the interconnect structure 132 can be electrically connected to other device through the bonded structure 160, the conductor 170, the interconnect structure 142, and the bonded structure 162.

Figure 2:
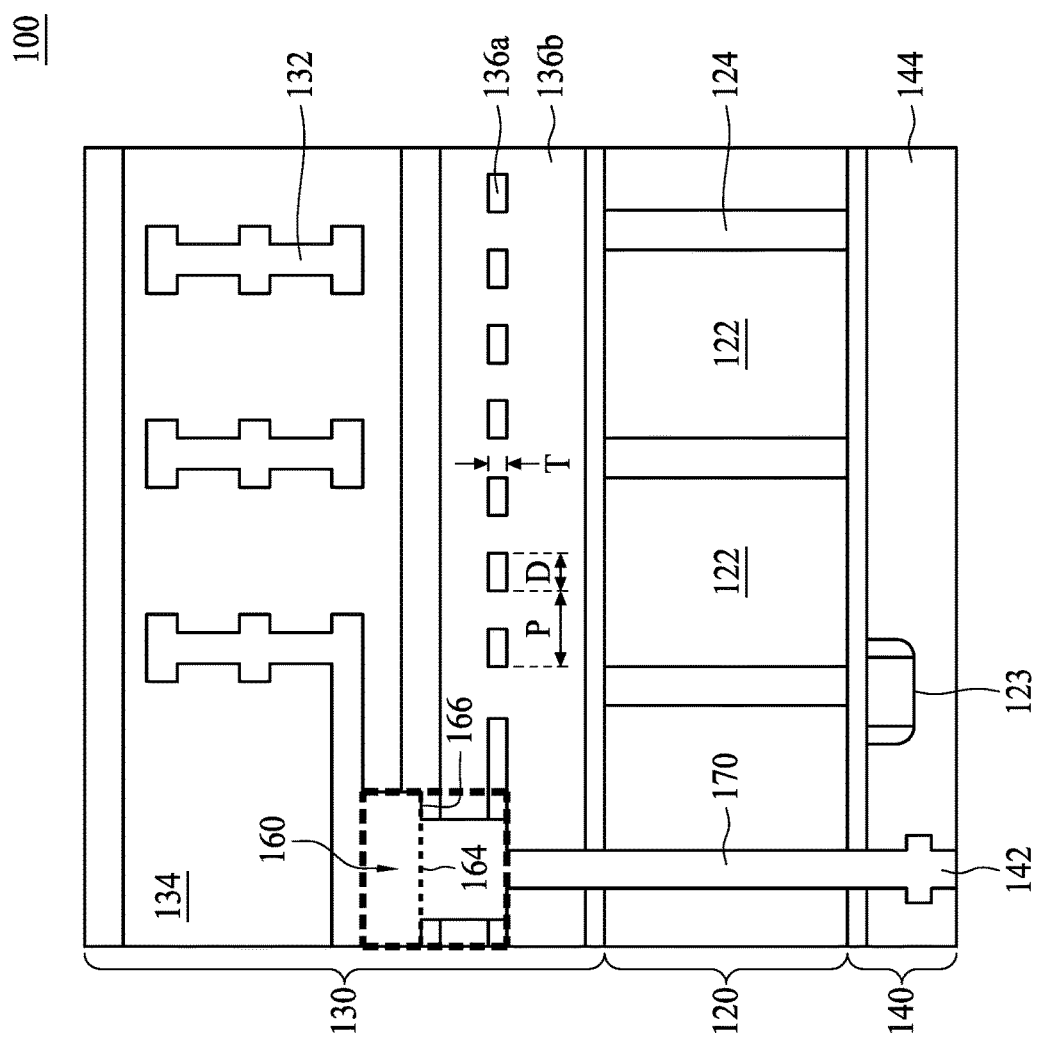
FIG. 2 is a partially enlarged view of a portion of a semiconductor image sensor according to aspects of the present disclosure.

Referring to FIG. 2, which is a partially enlarged view of a portion of the semiconductor image sensor 100. In some embodiments, the bonded structure 160 includes a hybrid bonding structure. For example but not limited to, the bonded structure 160 includes at least a metal-to-metal bonding interface 164 and a metal-to-dielectric bonding interface 166. In some embodiments, the bonded structure 160 can include a dielectric-to-dielectric bonding interface (not shown).

In some embodiments, the semiconductor image sensor 100 further includes a plurality of dielectric grating patterns 136a sandwiched between the interconnect structure 132 and the light sensing layer 120. In some embodiments, the connecting layer 130 can further includes a dielectric layer 136b disposed between the ILD layer 134 and the light sensing layer 120, and the dielectric grating patterns 136a are embedded in the dielectric layer 136b. In some embodiments, the bonded structure 160 penetrates a portion of the dielectric layer 136b and the dielectric grating pattern 136a, as shown in FIG. 2, but the disclosure is not limited thereto. In some embodiments, the dielectric grating patterns 136a can include dielectric material such as SiO, silicon carbide (SiC), silicon nitride (SiN), or silicon oxynitride (SiON), but the disclosure is not limited thereto. In some embodiments, the dielectric grating patterns 136a and the dielectric layer 136b can include different dielectric materials, but the disclosure is not limited thereto. Each of the dielectric grating patterns 136a can include a thickness T, and the thickness T can be between about 90 nanometers (nm) and about 220 nm in some embodiments, but the disclosure is not limited thereto. In some embodiments, a pitch P of the dielectric grating patterns 136a can be between about 0.55 micrometers (μm) and about 0.75 μm, but the disclosure is not limited thereto. In some embodiments, a duty ratio of a size D over the pitch P can be between about 25% and about 75%, but the disclosure is not limited thereto.

In some embodiments, the semiconductor image sensor 100 includes the dielectric grating patterns 136a introduced to reflect visible light back to the sensing devices 112, which construct the RGB image sensing system. Therefore, visible light pollution is reduced. Further, IR and/or NIR are reflected back to the sensing devices 122 by the conductive reflectors 146. Accordingly, quantum efficiency (QE) in IR and/or NIR wavelengths is improved.

Figure 3:
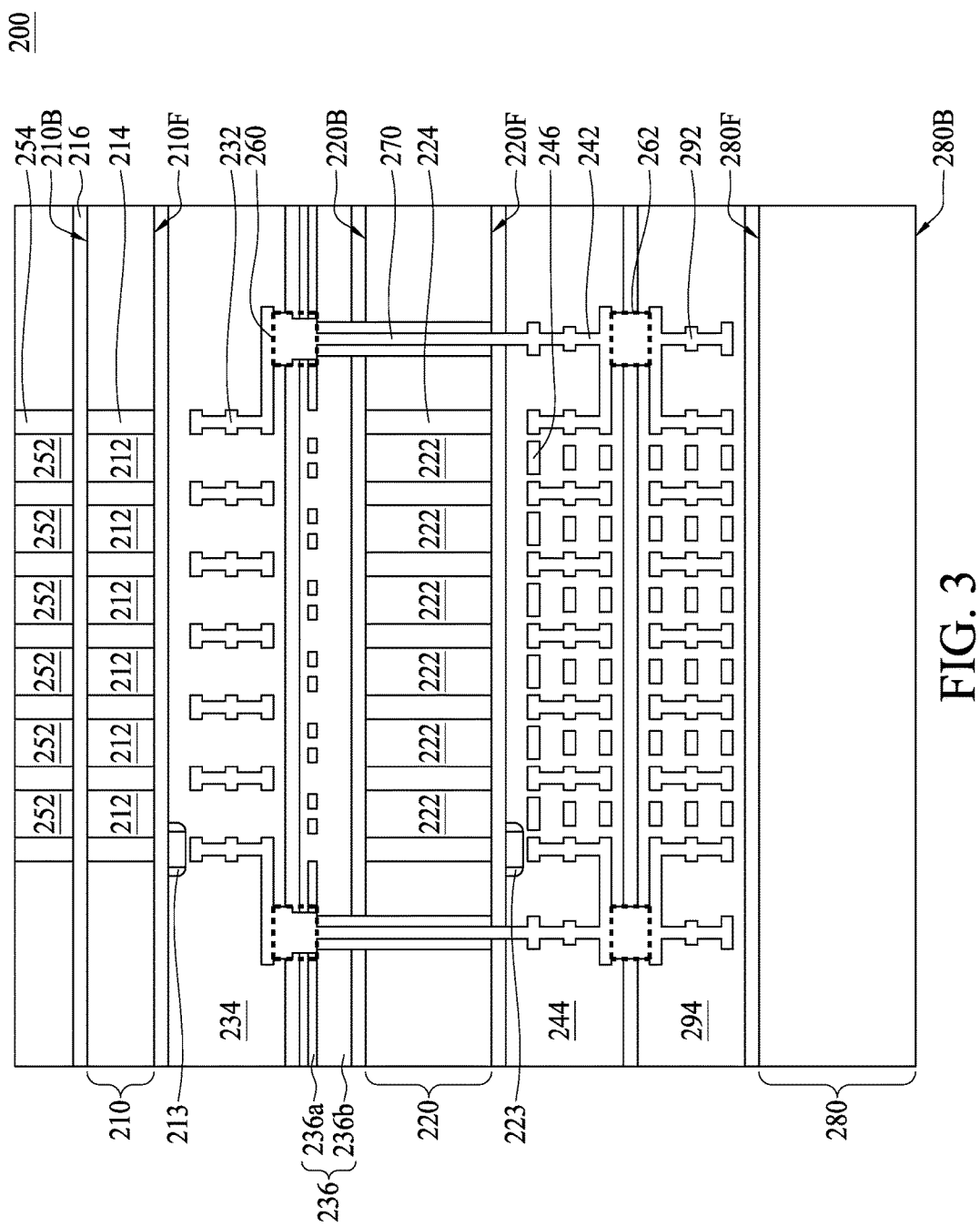
FIG. 3 is a schematic drawing illustrating a semiconductor image sensor according to aspects of the present disclosure.

FIG. 3 is a cross-sectional view of a semiconductor image sensor 200 according to aspects of the present disclosure in some embodiments. It should be noted that elements the same in the FIGS. 1-2 and 3 can include the same materials, and thus those details are omitted in the interest of brevity. In some embodiments, the semiconductor image sensor 200 includes a substrate 210 including a front side 210F and a back side 210B opposite to the front side 210F. In some embodiments, the substrate 210 can be a bulk semiconductor substrate such as a bulk Si substrate, or a SOI substrate, but the disclosure is not limited to this. Further, the substrate 210 includes a plurality of sensing devices 212 disposed therein. In some embodiments, the sensing devices 212 can be operated to sense visible light of incident light. As mentioned above, at least one logic device 213, such as a transistor, can be formed over the front side 210F of the substrate 210 and configured to enable readout of the plurality of sensing devices 212.

In some embodiments, a plurality of isolation structures 214 such as DTI structures is disposed in the substrate 210 to provide optical isolation between neighboring sensing devices 212, thereby serving as a substrate isolation grid and reducing cross-talk. In some embodiments, an interconnect structure 232 is disposed over the front side 210F of the substrate 210 and electrically connected to the logic device 213. As mentioned above, the interconnect structure 232 includes a plurality of BEOL metallization layer stacked in an ILD layer 234. In some embodiments, a plurality of optical structures such as color filters 252 and micro-lenses (not shown) respectively aligned with the plurality of sensing devices 212 are disposed over the substrate 210 on the back side 210B. In some embodiments, a passivation layer 216 can be disposed between the color filters 252 and the substrate 210, but the disclosure is not limited thereto. In some embodiments, a plurality of low-n structures 254 are disposed between the color filters 252, and the low-n structures 254 serve as a light guide to direct or reflect light to the color filters 252. The micro-lenses (not shown) that are used to focus incident light onto the corresponding sensing devices 212 is disposed over the color filters 252 and the low-n structure 254. As mentioned above, the color filters 252 are assigned to corresponding colors or wavelengths of lights, such that the color filters 252 include red color filters, green color filters and blue color filters. In some embodiments, the red color filters, the green color filters and the blue color filters are arranged in a Bayer mosaic pattern, but the disclosure is not limited thereto. Accordingly, in some embodiments, the micro-lenses, the color filters 252 and the sensing devices 212 may be a RGB image sensing system.

The semiconductor image sensor 200 further includes a substrate 220 including a front side 220F and a back side 220B opposite to the front side 220F. As mentioned above, the substrate 220 can be a bulk semiconductor substrate such as a bulk Si substrate, or a SOI substrate, but the disclosure is not limited to this. Further, the substrate 220 includes a plurality of sensing devices 222 disposed therein. The plurality of sensing devices 222 is disposed to receive light with a predetermined wavelength. In some embodiments, the sensing devices 222 can be operated to sense IR and/or NIR of the incident light. In some embodiments, each of the plurality of sensing devices 212 is aligned with one of the plurality of sensing devices 222. In some embodiments, a plurality of isolation structures 224 such as DTI structures is disposed in the substrate 220 to provide optical isolation between neighboring sensing devices 222, thereby serving as a substrate isolation grid and reducing cross-talk. As mentioned above, at least one logic device 223, such as a transistor, can be formed over the front side 220F of the substrate 220 and configured to enable readout of the plurality of sensing devices 222.

In some embodiments, an interconnect structure 242 is disposed over the front side 220F of the substrate 220 and electrically connected to the logic device 223. As mentioned above, the interconnect structure 242 includes a plurality of BEOL metallization layer stacked in an ILD layer 244. In some embodiments, a plurality of conductive reflectors 246 is disposed in the ILD layer 244. In some embodiments, the conductive reflectors 246 are disposed in the interconnect structure 242 proximal to the sensing devices 222, but the disclosure is not limited thereto. In some embodiments, each of the conductive reflectors 246 respectively corresponds to one of the sensing devices 222, but the disclosure is not limited thereto. In some embodiments, the conductive reflectors 246 can be physically and electrically isolated from the interconnect structure 242. In some embodiments, an insulating structure 236 is disposed over the back side 220B of the substrate 220. In some embodiments, the insulating structure 236 includes a plurality of dielectric grating patterns 236a embedded in a dielectric layer 236b. Materials of the dielectric grating patterns 236a and the dielectric layer 23b can be similar as those detailed above, thus those details are omitted for simplicity. Similarly, thickness T, pitch P, and duty ratio of the dielectric grating patterns 236a can be similar as those detailed above, thus those details are omitted for simplicity.

The semiconductor image sensor 200 further includes a substrate 280 including a front side 280F and a back side 280B opposite to the front side 280F. As mentioned above, the substrate 280 can be a bulk semiconductor substrate such as a bulk Si substrate, or a SOI substrate, but the disclosure is not limited to this. In some embodiments, the substrate 280 includes readout circuits, image signal processing (ISP) circuits, and/or application-specific integrated circuits (ASIC), but the disclosure is not limited thereto. In some embodiments, an interconnect structure 292 is disposed over the front side 280F of the substrate 280 and electrically connected to the circuits. As mentioned above, the interconnect structure 292 includes a plurality of BEOL metallization layer stacked in an ILD layer 294.

It should be noted that the interconnect structures 232, 242 and 292 are disposed over the front sides 210F, 220F and 280F of the substrate 210, 220 and 280. More importantly, the back side 220B of the substrate 220 faces the front side 210F of the substrate 210, and the front side 220F of the substrate 220 faces the front side 280F of the substrate 280. Further, the interconnect structure 242 over the front side 220F of the substrate 220 is bonded to the interconnect structure 292 over the front side 280F of the substrate 280 while the interconnect structure 232 over the front side 210F of the substrate 210 is bonded to the back side 220B of the substrate 220. In some embodiments, the semiconductor image sensor 200 further includes at least one bonded structure 260 disposed between the interconnect structure 232 and the substrate 220. The bonded structure 260 helps bonding between the substrate 210 and the substrate 220. In some embodiments, the bonded structure 260 is disposed between the dielectric grating patterns 236a and the interconnect structure 232, but disclosure is not limited to this. In some embodiments, the bonded structure 260 penetrates a portion of the dielectric layer 236b and the dielectric grating pattern 236a, as shown in FIG. 3, but the disclosure is not limited thereto. Further, the bonded structure 260 is electrically connected to the interconnect structure 232. In some embodiments, the bonded structure 260 includes a hybrid bonding structure. For example but not limited to, the bonded structure 260 can includes at least a metal-to-metal bonding interface, a metal-to-dielectric bonding interface, and a dielectric-to-dielectric bonding interface (not shown).

In some embodiments, the semiconductor image sensor 200 further includes at least one bonded structure 262 disposed between the interconnect structure 242 and interconnect structure 292. The bonded structure 262 helps bonding between the substrate 220 and the substrate 280. In some embodiments, the bonded structure 262 penetrates a portion of the ILD layer 244 and a portion of the ILD layer 294, as shown in FIG. 3, but the disclosure is not limited thereto. Further, the bonded structure 262 is electrically connected to the interconnect structure 242 and the interconnect structure 292. In some embodiments, the bonded structure 262 includes a hybrid bonding structure. For example but not limited to, the bonded structure 262 can includes at least a metal-to-metal bonding interface, a metal-to-dielectric bonding interface, and a dielectric-to-dielectric bonding interface (not shown).

In some embodiments, the semiconductor image sensor 200 further includes at least one conductor 270 penetrating a portion of the dielectric layer 236b, the substrate 220, and a portion of the ILD layer 244. More importantly, the conductor 270 electrically connects the bonded structure 260 and the interconnect structure 242, as shown in FIG. 2.

Accordingly, the circuits on the substrate 210 can be electrically connected to the circuit on the substrate 280 through the interconnect structure 232, the bonded structure 260, the conductor 270, the interconnect structure 242, the bonded structure 262, and the interconnect structure 292.

In some embodiments, the semiconductor image sensor 200 includes the dielectric grating patterns 236a to reflect visible light back to the sensing devices 212, which construct the RGB image sensing system. Therefore, visible light pollution is reduced. Further, IR and/or NIR are reflected back to the sensing devices 222 by the conductive reflectors 246. Accordingly, QE in IR and/or NIR wavelengths is improved. Further, since the interconnect structure 242 over the front side 220F of the substrate 220 faces the substrate 280, the interconnect structure 242 is no longer located in a direct light path. Consequently, BEOL routing for the interconnect structure 242 is simplified because direct light path is not an issue for the interconnect structure 242. Further, since the back side 220B of the substrate 220 faces the substrate 210, the substrate 220 can be further thinned and thus IR/NIR loss is further reduced.

Figure 4:
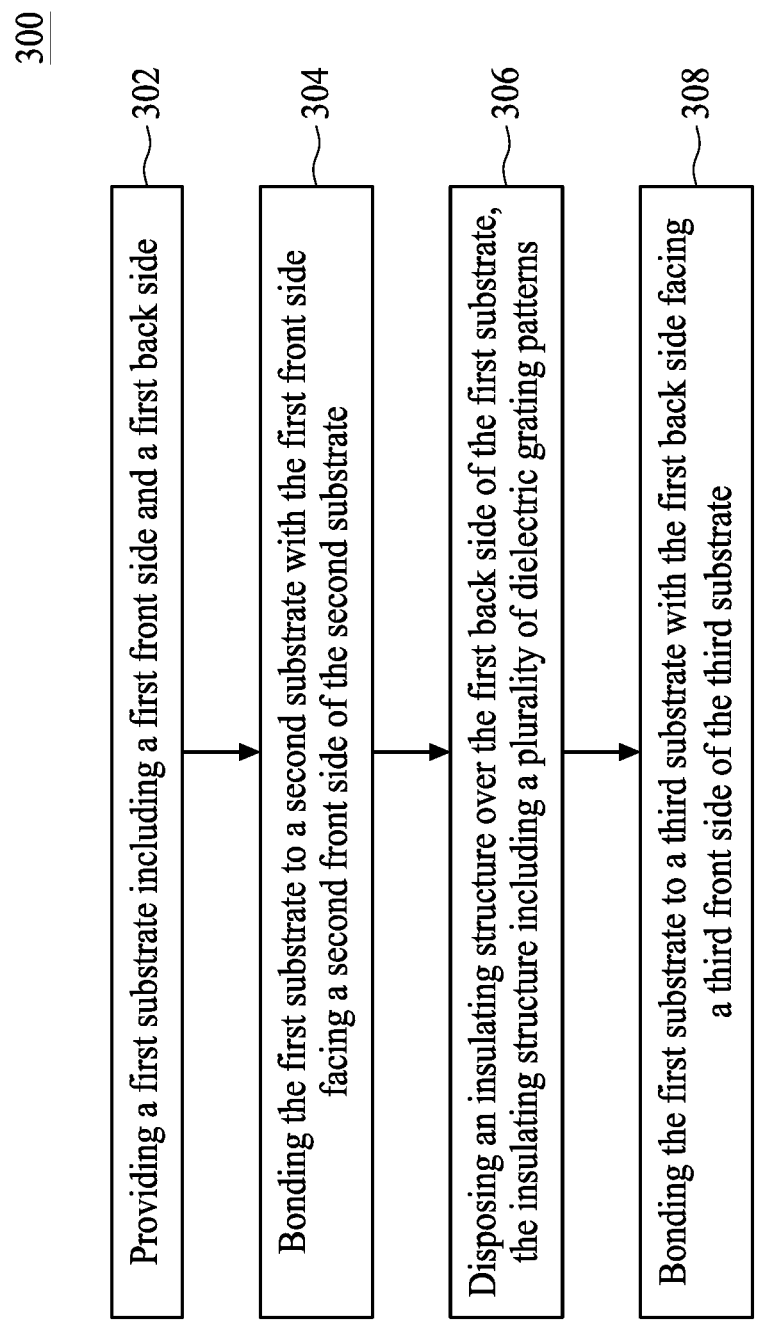
FIG. 4 shows a flow chart representing method for forming a semiconductor image sensor according to aspects of the present disclosure.

Please refer to FIG. 4 and FIGS. 5A-12. FIG. 4 shows a flow chart representing method for forming a semiconductor image sensor according to aspects of the present disclosure, and FIGS. 5A-12 are a series of cross-sectional views of a semiconductor image sensor at various fabrication stages constructed according to aspects of the present disclosure in one or more embodiments. In the present disclosure, a method of manufacturing a semiconductor image sensor 300 is also disclosed. In some embodiments, a semiconductor image sensor structure 200 can be formed by the method 300. The method 300 includes a number of operations and the description and illustration are not deemed as a limitation as the sequence of the operations. The method 300 includes a number of operations (302, 304, 306, and 308). Additionally, it should be noted that elements the same in FIGS. 2 and 5A-12 are designated by the same numerals, and can include the same materials, thus those details are omitted in the interest of brevity.

Figure 5A:
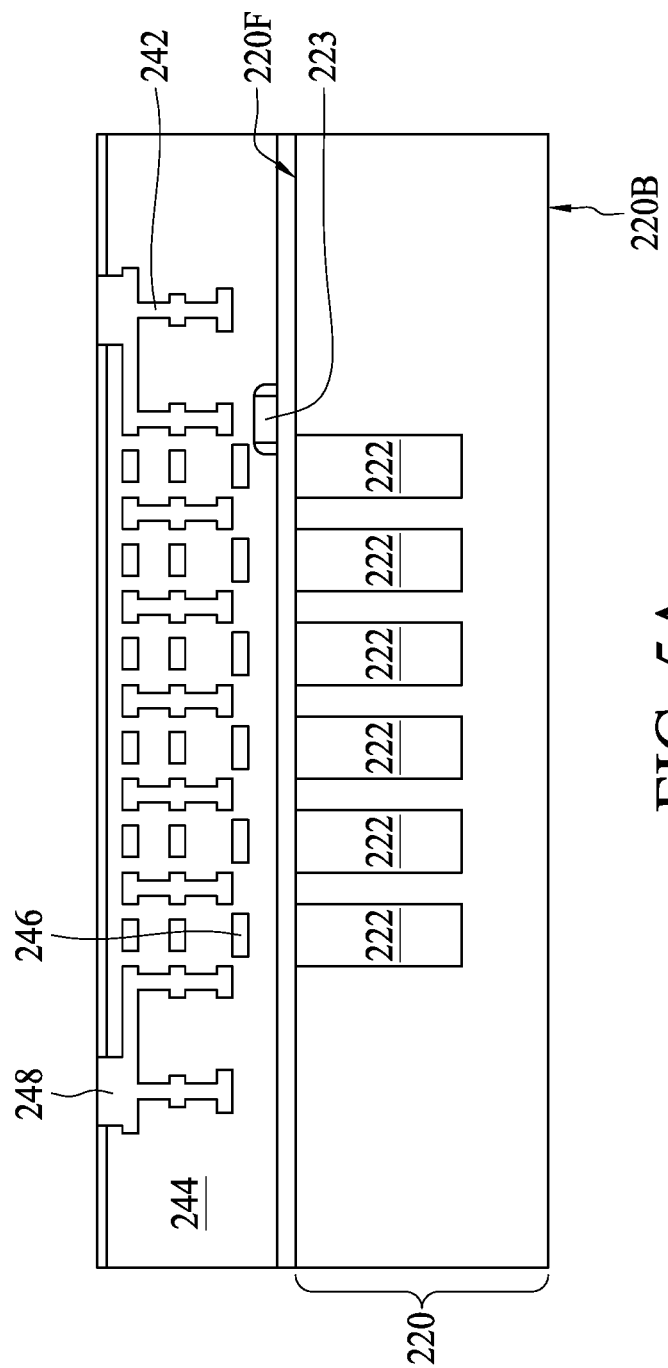
FIGS. 5A-12 are a series of cross-sectional views of a semiconductor image sensor at various fabrication stages constructed according to aspects of the present disclosure in one or more embodiments.

In operation 302, a first substrate 220 is provided or received as shown in FIG. 5A. In some embodiments, the first substrate 220 includes a first front side 220F and a first back side 220B opposite to the first front side 220F. A plurality of first sensing devices 222 is formed in the first substrate 220. In some embodiments, the first sensing devices 222 are formed near the first front side 220F, as shown in FIG. 5A. In some embodiments, the first sensing devices 222 can be operated to sense infrared (IR) and/or near-infrared (NIR) of the incident light, but the disclosure is not limited to this. Further, at least one first logic device 223, such as a first transistor, can be configured to enable readout of the first sensing devices 222. The first substrate 220 further includes a first interconnect structure 242 disposed over the first front side 220F. In some embodiments, the first interconnect structure 242 includes a plurality of BEOL metallization layers stacked in a first ILD layer 244. One or more contacts of the first interconnect structure 242 are electrically connected to the first logic device 223. In some embodiments, the semiconductor image sensor 200 further includes a plurality of conductive reflectors 246 disposed in the first ILD layer 244. In some embodiments, the conductive reflectors 246 are disposed in the first ILD layer 244 proximal to the first substrate 220, but the disclosure is not limited thereto. In some embodiment, the conductive reflectors 246 can be formed before or during forming the first interconnect structure 242. In some embodiments, the conductive reflectors 246 can be physically and electrically isolated from the first interconnect structure 242. In some embodiments, the conductive reflectors 246 are aligned to and overlapped by the first sensing devices 222, as shown in FIG. 5A, but the disclosure is not limited to this. Further, at least one first bonding pad 248 is disposed over the first interconnect structure 242. As shown in FIG. 5A, the first bonding pad 248 is physically and electrically connected to the first interconnect structure 242.

Figure 5B:
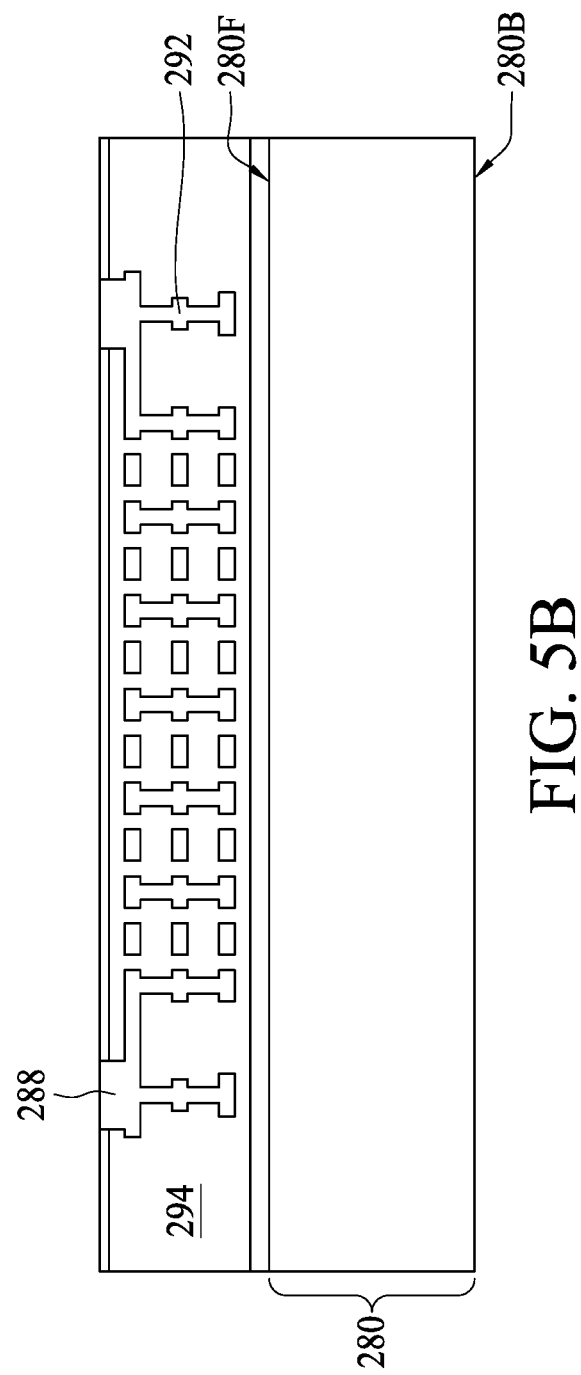

In some embodiments, a second substrate 280 can be provided or received, as shown in FIG. 5B. The second substrate 280 includes a second front side 280F and a second back side 280B opposite to the second front side 280F. In some embodiments, the second substrate 280 includes readout circuits, image signal processing (ISP) circuits, and/or application-specific integrated circuits (ASIC), but the disclosure is not limited thereto. In some embodiments, a second interconnect structure 292 is disposed over the second front side 280F of the second substrate 282 and electrically connected to the circuits. As mentioned above, the second interconnect structure 292 includes a plurality of BEOL metallization layer stacked in a second ILD layer 294. Further, at least one second bonding pad 288 is disposed over the second interconnect structure 292, and the second bonding pad 288 is electrically connected to the second interconnect structure 292.

Figure 6:
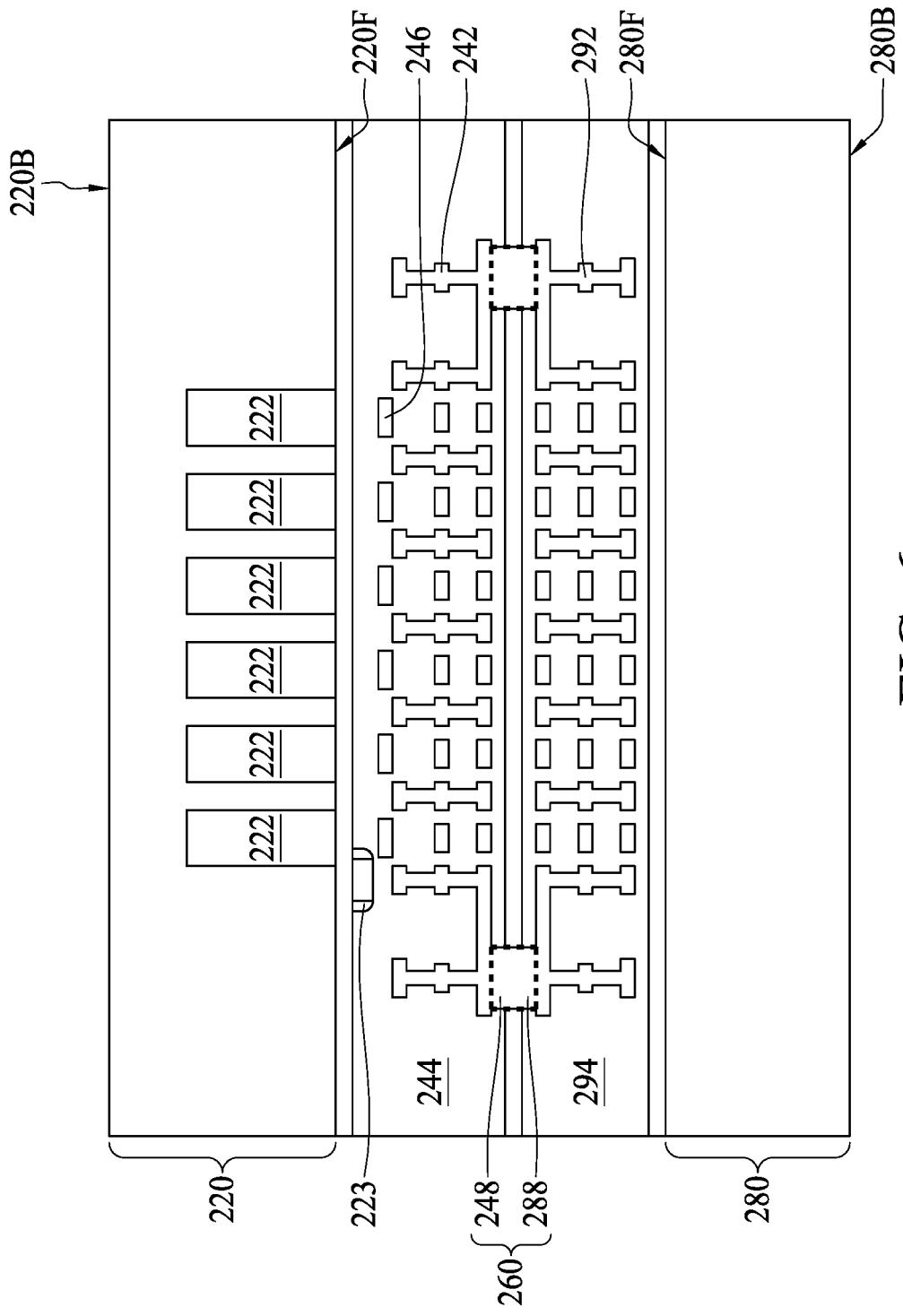

In operation 304, the first substrate 220 is bonded to the second substrate 280. Referring to FIG. 6, the first substrate 220 is flipped over such that the first front side 220F of the first substrate 220 faces the second front side 280F of the second substrate 280. Consequently, the first interconnect structure 242 is posed to face the second interconnect structure 292. The first substrate 220 is bonded to the second substrate 280, and the first interconnect structure 242 is bonded to the second interconnect structure 292 by the first bonding pad 248 and the second bonding pad 288. Accordingly, at least one first bonded structure 262 disposed between the entire first interconnect structure 242 and the entire second interconnect structure 292 is obtained as shown in FIG. 6. Further, the first interconnect structure 242, the second interconnect structure 292, and the bonded structure 262 are all disposed between the first substrate 220 and the second substrate 280. As mentioned above, the first bonded structure 262 can include a hybrid bonding structure including at least a metal-to-metal interface and a dielectric-to-dielectric interface. In some embodiments, the first bonded structure 262 can include a metal-to-dielectric interface.

Figure 7:
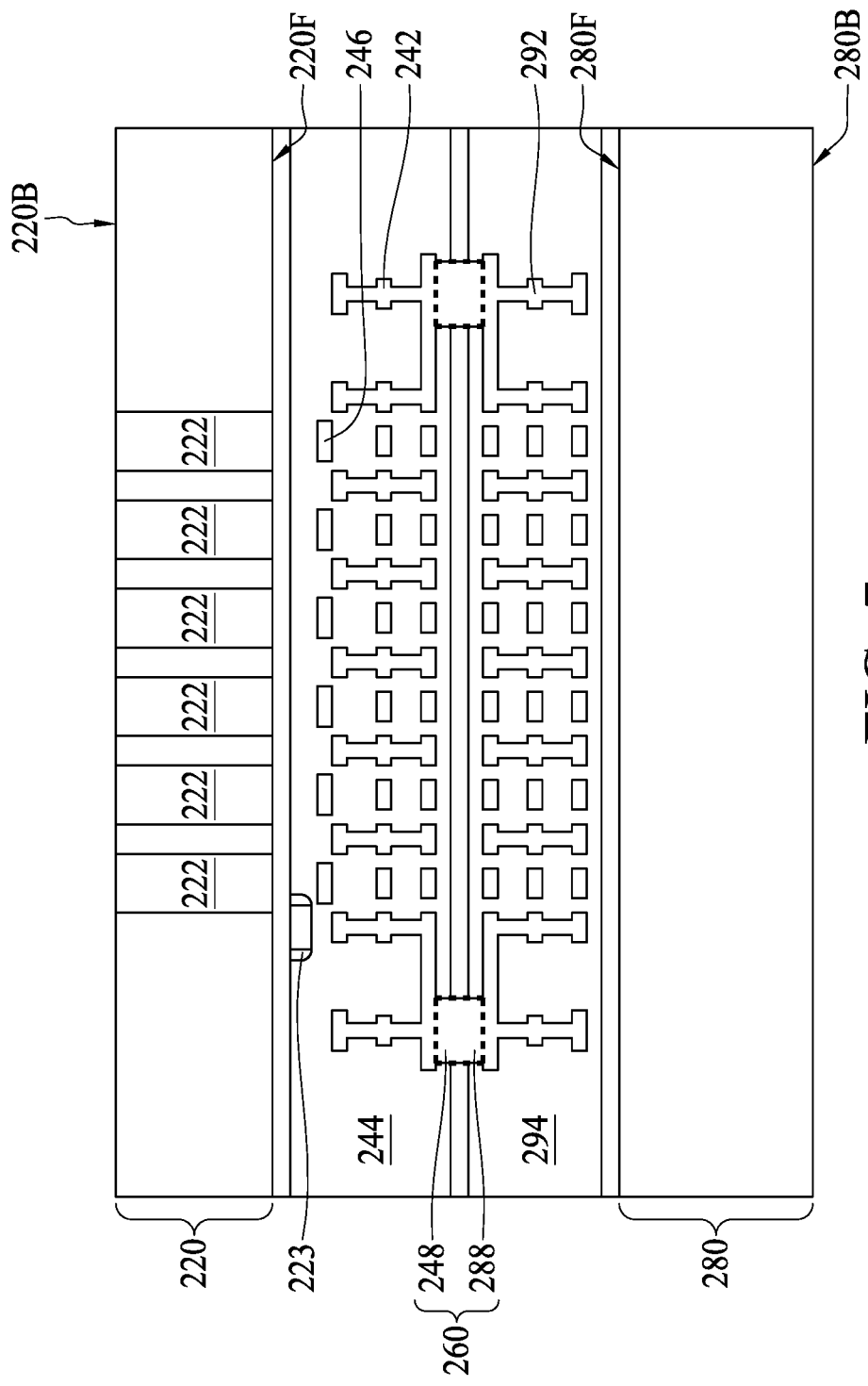

Referring to FIG. 7, in some embodiments, a thinning operation can be performed to thin down the first substrate 220 from the first back side 220B after bonding the first substrate 220 to the second substrate 280. Accordingly, a thickness of the first substrate 220 is reduced. In some embodiments, the thinning operation is performed to expose the sensing devices 222, as shown in FIG. 7.

Figure 8:
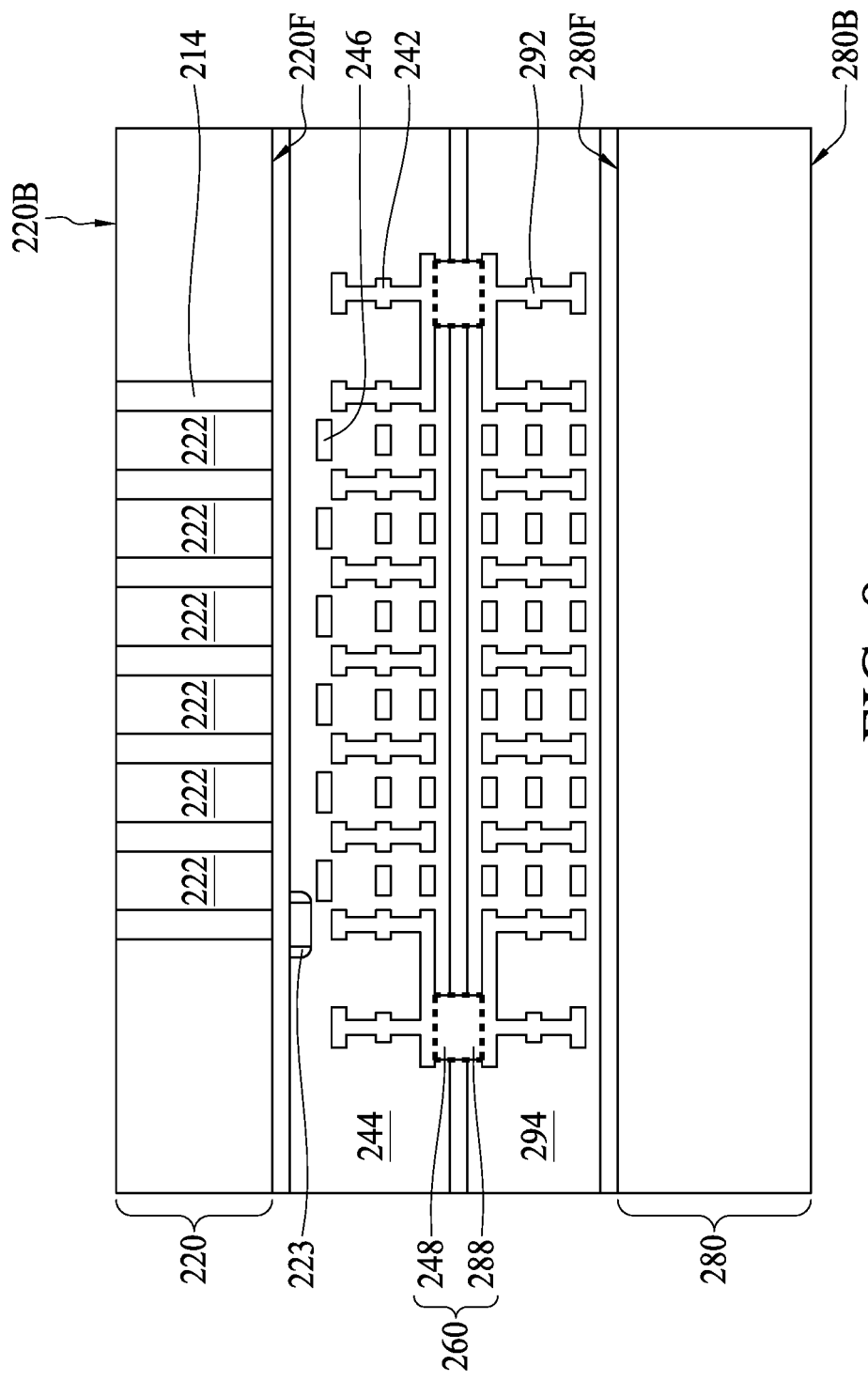

Referring to FIG. 8, after thinning down the first substrate 220 from the first back side 220B, a plurality of isolation structures 214 such as DTI structures is disposed in the first substrate 220 to provide optical isolation between neighboring sensing devices 222, thereby serving as a substrate isolation grid and reducing cross-talk.

Figure 9:
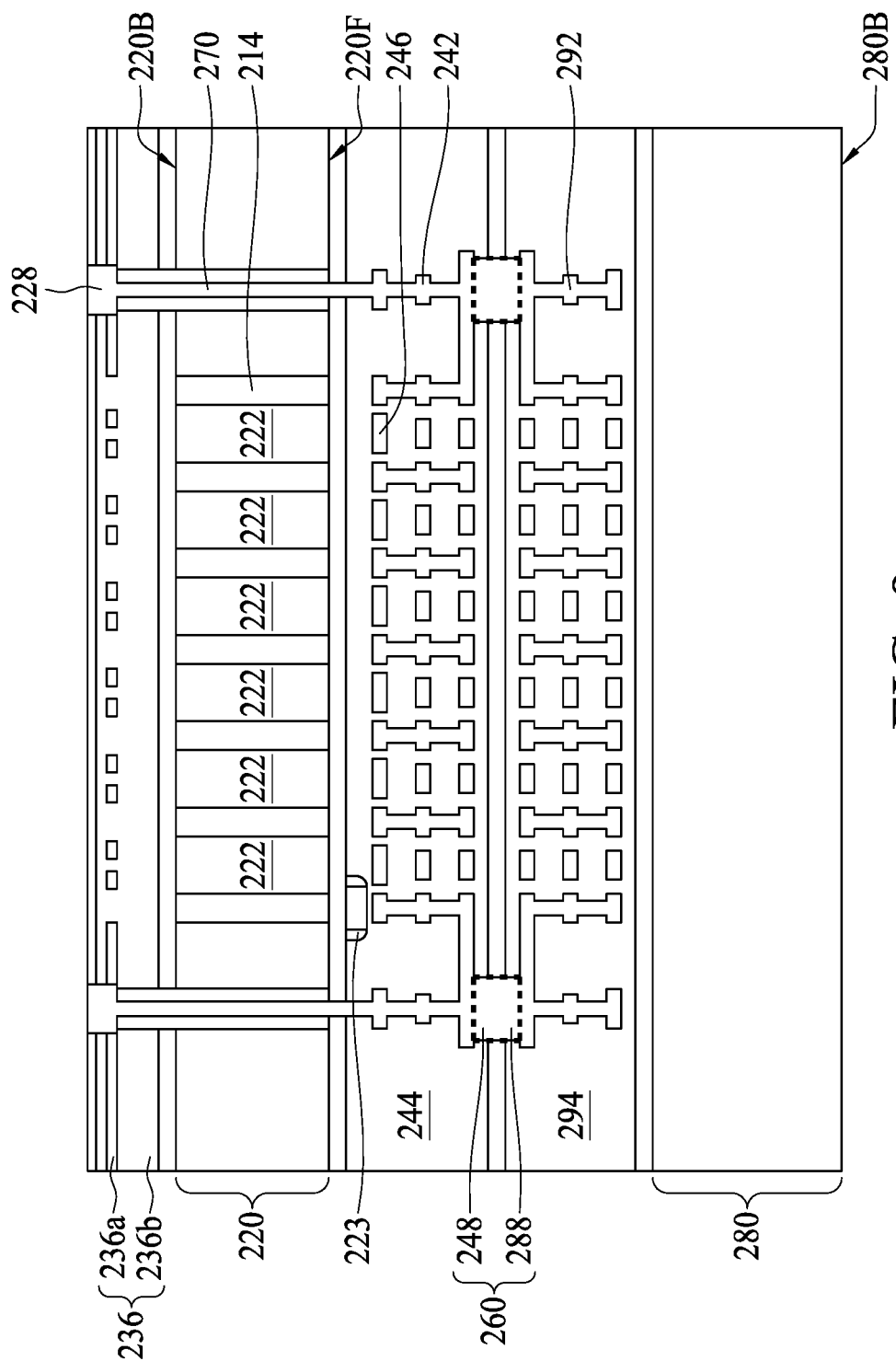

In operation 306, an insulating structure 236 is disposed over the back side 220B of the substrate 220. In some embodiments, the insulating structure 236 includes a plurality of dielectric grating patterns 236a embedded in a dielectric layer 236b. Materials of the dielectric grating patterns 236a and the dielectric layer 236b can be similar as those detailed above, thus those details are omitted for simplicity. Similarly, thickness T, pitch P, and duty ratio of the dielectric grating patterns 236a can be similar as those detailed above, thus those details are omitted for simplicity. Further, at least one conductor 270 penetrating a portion of the dielectric layer 236b, the substrate 220, and a portion of the ILD layer 244 is formed. More importantly, the conductor 270 is electrically connected to the first interconnect structure 242, as shown in FIG. 9. In some embodiments, a portion of the dielectric layer 236b is disposed over the first back side 220B of the first substrate 220, and the conductor 270 is formed to penetrate the portion of the dielectric layer 236b. Thereafter, the dielectric grating patterns 236a and another portion of the dielectric layer 236b are formed over the first back side 220B of the first substrate 220. Therefore, at least a portion of the dielectric layer 236b and at least a portion of the dielectric grating patterns 236a surround the conductor 270, as shown in FIG. 9. However, in some embodiments, a portion of the dielectric layer 236b is disposed over the first back side 220B of the first substrate 220, the dielectric grating patterns 236a are then disposed over the portion of the dielectric layer 236b, and another portion of the dielectric layer 236b is formed over the dielectric grating patterns 236a. Then the conductor 270 is formed to penetrate the dielectric layer 236b and the dielectric grating patterns 236a, as shown in FIG. 9. After forming the conductor 270, a third bonding pad 228 is disposed over the back side 220B of the substrate 220. As shown in FIG. 9, the third bonding pad 228 is electrically connected to the conductor 270. In some embodiments, the third bonding pad 228 is electrically connected to the circuit over the second substrate 280 through the conductor 270, the first interconnect structure 242, the first bonded structure 262, and the second interconnect structure 292.

Figure 10:
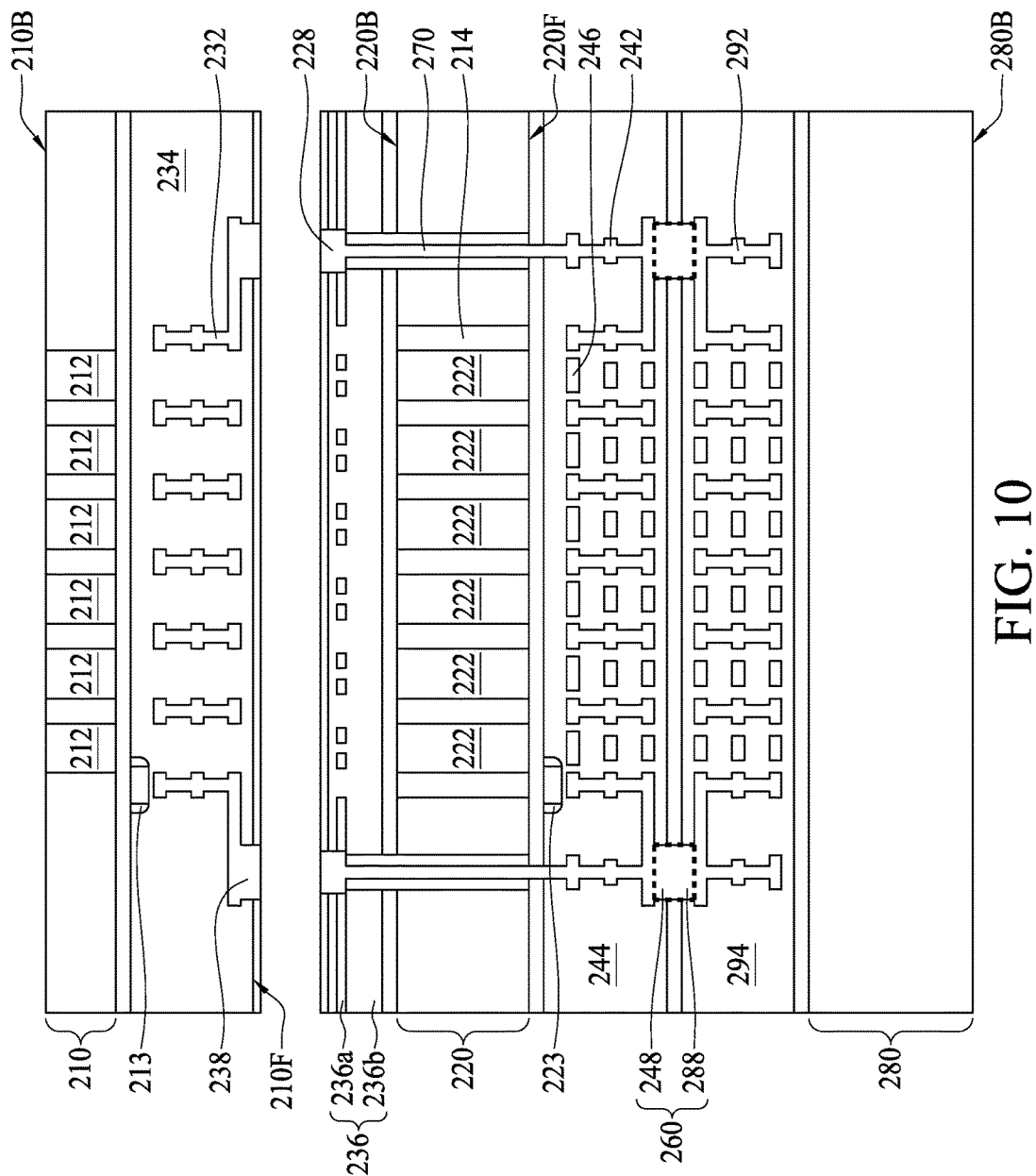

Referring to FIG. 10, in some embodiments, a third substrate 210 is provided or received. The third substrate 210 includes a third front side 210F and a third back side 210B opposite to the third front side 210F. Further, the third substrate 210 includes a plurality of second sensing devices 212 disposed therein. In some embodiments, the second sensing devices 212 can be operated to sense visible light of incident light. As mentioned above, at least one second logic device 213, such as a transistor, can be formed over the third front side 210F of the third substrate 210 and configured to enable readout of the plurality of second sensing devices 212. In some embodiments, a third interconnect structure 232 is disposed over the third front side 210F of the third substrate 210 and electrically connected to the second logic devices. As mentioned above, the third interconnect structure 232 includes a plurality of BEOL metallization layer stacked in a third ILD layer 234. Further, at least one fourth bonding pad 238 is disposed over the third interconnect structure 232, and the fourth bonding pad 238 is electrically connected to the third interconnect structure 232.

Figure 11:
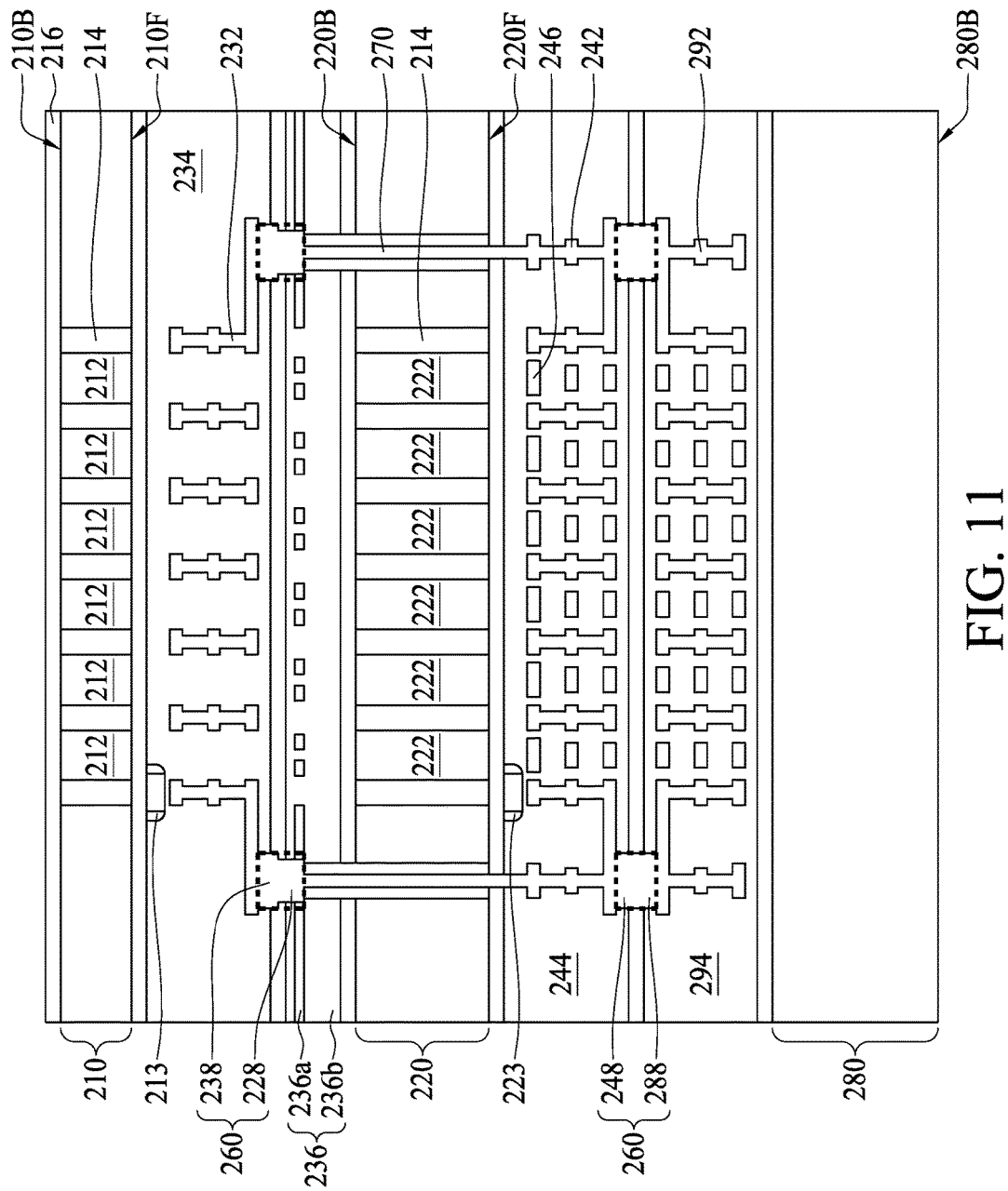

In operation 308, the first substrate 220 is bonded to the third substrate 210 with the first back side 220B facing the third front side 210F. More importantly, the first back side 220B of the first substrate 220 is bonded to the third front side 210F of the third substrate 210. As show in FIG. 11, the third substrate 210 is flipped such that the third interconnect structure 232 is posed to face the first back side 220B of the first substrate 220. Then the third interconnect structure 232 is bonded to the first substrate 220 by the third bonding pad 228 and the fourth bonding pad 238. Accordingly, at least one second bonded structure 260 disposed between the entire third interconnect structure 232 and the first substrate 220 is obtained as shown in FIG. 11. As mentioned above, the second bonded structure 260 can include a hybrid bonding structure including at least a metal-to-metal interface and a dielectric-to-dielectric interface. In some embodiments, the second bonded structure 260 can include a metal-to-dielectric interface. Accordingly, the first interconnect structure 242 is electrically connected to the third interconnect structure 232 through the second bonded structure 260 and the conductor 270. Additionally, the first sensing devices 222 are respectively aligned to the second sensing devices 212. Further, the first sensing devices 222 are disposed between the first logic device 223 and the second logic device 213.

In some embodiments, another thinning operation can be performed to thin down the third substrate 210 from the third back side 210B after bonding the third substrate 210 to the first substrate 220. Accordingly, a thickness of the third substrate 210 is reduced. In some embodiments, the thinning operation is performed to expose the second sensing devices 212. In some embodiments, a plurality of isolation structures 214 such as DTI structures is disposed in the third substrate 210 to provide optical isolation between neighboring second sensing devices 212, thereby serving as a substrate isolation grid and reducing cross-talk. In some embodiments, an insulating layer 216 is disposed over the third back side 210B of the third substrate 210.

Figure 12:
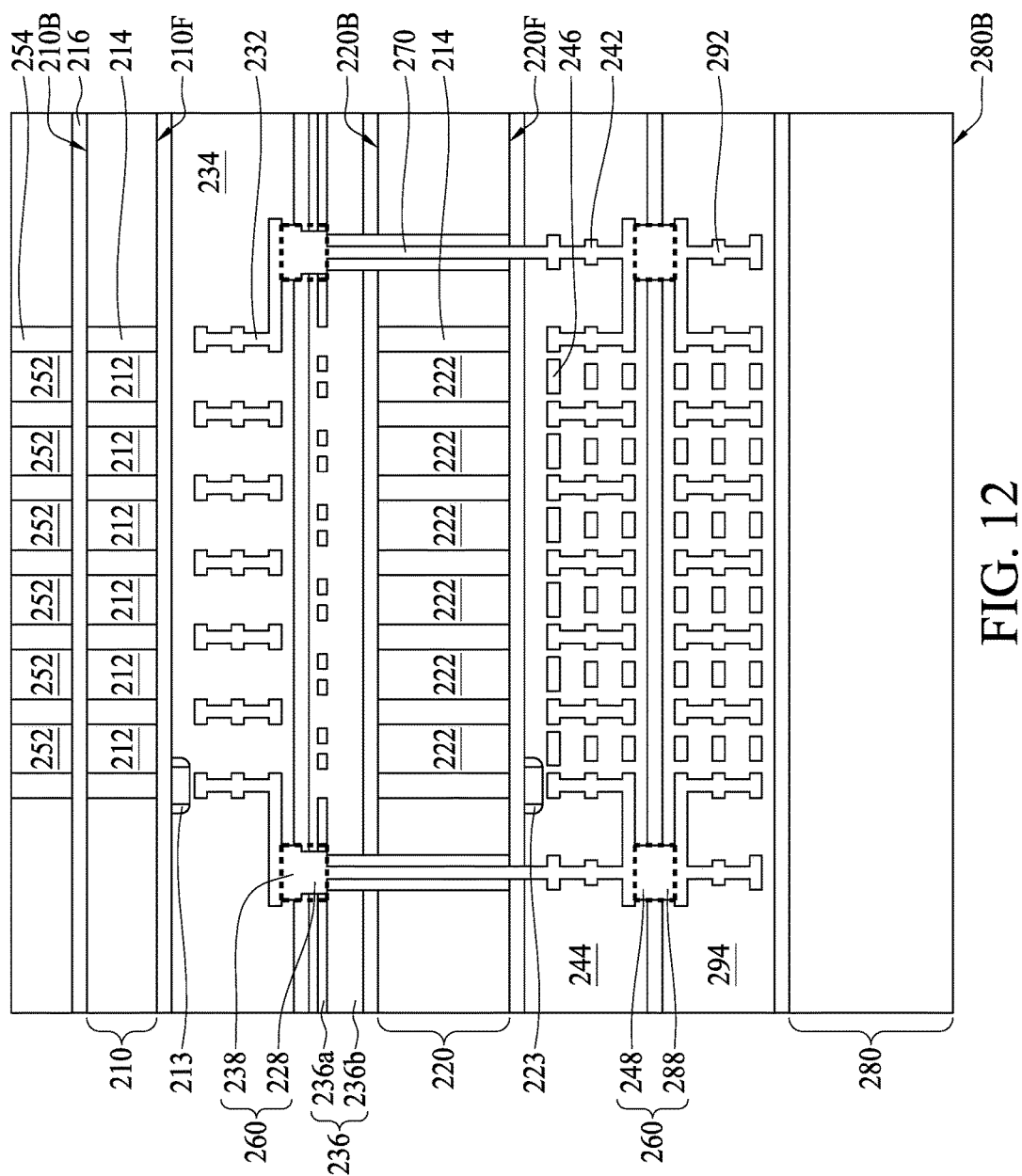

Referring to FIG. 12, next, a plurality of optical structures is disposed over the third back side 210B of the third substrate 210. For example, the plurality of optical structures such as color filters 252 and micro-lenses respectively aligned with the plurality of sensing devices 212 are disposed over the third substrate 210 over the third back side 210B. In some embodiments, a passivation layer 216 can be disposed between the color filters 252 and the third substrate 210, but the disclosure is not limited thereto. In some embodiments, a plurality of low-n structures 254 are disposed between the color filters 252, and the low-n structures 254 serves as a light guide to direct or reflect light to the color filters 252. The micro-lenses (not shown) that are used to focus incident light onto the corresponding sensing devices 212 is disposed over the color filters 252 and the low-n structure 254. As mentioned above, the color filters 252 are assigned to corresponding colors or wavelengths of lights, accordingly the micro-lenses, the color filters 252 and the second sensing devices 212 may be a RGB image sensing system.

Still referring to FIG. 12, thus, a dual-level semiconductor image sensor 200 including the visible light sensing devices and the IR/NIR sensing devices is obtained. As shown in FIG. 12, in some embodiments, the first sensing devices 222, which are the visible light sensing devices, are referred to as level-1 sensing devices while the second sensing devices 212, which are the IR/NIR sensing devices, are referred as level-2 sensing devices. And both of the level-1 sensing devices 222 and the level-2 sensing devices 212 adopt back side illumination (BSI) approach. Since each of the second sensing devices 212 overlaps each of the first sensing devices 222, the IR/NIR resolution is increased to be substantially the same as the visible light resolution. And since IR/NIR enters the first sensing devices 222 from the first back side 220B of the first substrate 220, the first interconnect structure 242 over the first front side 220F of the first substrate 220 is no longer located in the direct light path. Consequently, BEOL routing for the first interconnect structure 242 can simplified. Further, back side operations such as thinning operation, DTI structure formation, and introduction of the dielectric grating patterns 236a are easily integrated. As mentioned above, by thinning the first substrate 220 from the first back side 220B, IR/NIR path can be shortened and thus IR/NIR loss is further reduced. As mentioned above, by introducing the dielectric grating patterns 236a in the insulating structure 236 between the first substrate 220 and the third substrate 210, visible light is reflected back to the second sensing devices 212. Therefore, visible light pollution is reduced. Further, IR and/or NIR are reflected back to the first sensing devices 222 by the conductive reflectors 246. Accordingly, QE in IR and/or NIR wavelengths is improved.

Accordingly, the present disclosure therefore provides a dual-level semiconductor image sensor including the integrated visible light sensing devices and IR/NIR sensing devices. In some embodiments, the visible light sensing devices and the IR/NIR sensing devices of the semiconductor image sensor includes same resolution. Further, NIR signal loss and visible light pollution are both reduced while the IR/NIR cancellation capability is improved in some embodiments. The present disclosure further provides a method for forming the semiconductor image sensor that is able to simplify BEOL routing, integrate back side operations to both the visible light sensing devices and IR/NIR sensing devices, and improve integration of the visible light sensing devices and IR/NIR sensing devices.

In some embodiments, a semiconductor image sensor is provided. The semiconductor image sensor includes a first light sensing layer including a plurality of first sensing devices, a second light sensing layer including a plurality of second sensing devices, a first interconnect structure sandwiched between the first light sensing layer and the second light sensing layer, a second interconnect structure, a first logic device between the first sensing layer and the first interconnect structure, and a second logic device between the second light sensing layer and the second interconnect structure. In some embodiments, the second light sensing layer is between the first logic device and the second logic device.

In some embodiments, a semiconductor image sensor is provided. The semiconductor image sensor includes a first substrate including a first front side and a first back side opposite to the front side, a first interconnect structure disposed over the first front side of the first substrate, a second substrate including a second front side and a second back side opposite to the second front side, a second interconnect structure disposed over the second front side of the second substrate, a third substrate including a third front side and a third back side opposite to the third front side, and a third interconnect structure disposed over the third front side of the third substrate. In some embodiments, the first substrate includes a plurality of first sensing devices, and the second substrate includes a plurality of second sensing devices. In some embodiments, the second back side of the second substrate faces the first front side of the first substrate, and the second front side of the second substrate faces the third front side of the third substrate.

In some embodiments, a method for forming a semiconductor image sensor is provided. The method includes: providing a first substrate including a first front side and a first back side opposite to the first front side, and the first substrate including a plurality of first sensing devices; bonding the first substrate to a second substrate including a second front side and a second back side opposite to the second front side with the first front side of the first substrate facing the second front side of the second substrate; disposing an insulating structure over the first back side of the first substrate, wherein the insulating structure includes a plurality of dielectric grating patterns; and bonding the first substrate to a third substrate including a third front side and a third back opposite to the third front side, and the third substrate including a plurality of second sensing devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image sensor comprising:
   a first light sensing layer comprising a plurality of first sensing devices;
   a second light sensing layer comprising a plurality of second sensing devices;
   a first interconnect structure sandwiched between the first light sensing layer and the second light sensing layer;
   a second interconnect structure;
   a first logic device between the first light sensing layer and the first interconnect structure;
   a second logic device between the second light sensing layer and the second interconnect structure; and
   at least one bonded structure disposed between the first interconnect structure and the second light sensing layer,
   wherein the second light sensing layer is between the first logic device and the second logic device.

2. The semiconductor image sensor of claim 1, further comprises a plurality of dielectric grating patterns sandwiched between the first interconnect structure and the second light sensing layer.

3. The semiconductor image sensor of claim 2, wherein the plurality of dielectric grating patterns overlap the plurality of second sensing devices.

4. The semiconductor image sensor of claim 1, further comprises a plurality of conductive reflectors disposed in the second interconnect structure.

5. The semiconductor image sensor of claim 1, further comprising at least one conductor penetrating the second light sensing layer, and the conductor electrically connecting to the bonded structure.

6. The semiconductor image sensor of claim 1, wherein each of the first sensing devices is aligned with one of the second sensing devices.

7. The semiconductor image sensor of claim 1, further comprising an optical layer disposed over the first light sensing layer, wherein the optical layer comprises a plurality of color filters, and the plurality of color filters respectively aligned with the plurality of first sensing devices.

8. The semiconductor image sensor of claim 1, wherein the bonded structure is electrically connected to the first interconnect structure.

9. A semiconductor image sensor comprising:
   a first light sensing layer comprising a plurality of first sensing devices;
   a second light sensing layer comprising a plurality of second sensing devices;
   a first interconnect structure sandwiched between the first light sensing layer and the second light sensing layer;
   a second interconnect structure;

a first logic device between the first light sensing layer and the first interconnect structure;
a second logic device between the second light sensing layer and the second interconnect structure;
at least one bonded structure disposed between the first interconnect structure and the second light sensing layer; and
at least one conductor penetrating the second light sensing layer, wherein the second light sensing layer is between the first logic device and the second logic device, and the conductor is electrically connected to the bonded structure.

10. The semiconductor images sensor of claim 9, wherein each of the first sensing devices is aligned with one of the second sensing devices.

11. The semiconductor image sensor of claim 9, further comprises a plurality of dielectric grating patterns sandwiched between the first interconnect structure and the second light sensing layer, wherein the plurality of dielectric grating patterns overlap the plurality of second sensing devices.

12. The semiconductor image sensor of claim 9, wherein the bonded structure is electrically connected to the first interconnect structure.

13. The semiconductor image sensor of claim 9, further comprises a plurality of conductive reflectors disposed in the second interconnect structure.

14. The semiconductor image sensor of claim 9, further comprising an optical layer disposed over the first light sensing layer, wherein the optical layer comprises a plurality of color filters, and the plurality of color filters respectively aligned with the plurality of first sensing devices.

15. A semiconductor image sensor comprising:
a first light sensing layer comprising a plurality of first sensing devices;
a second light sensing layer comprising a plurality of second sensing devices;
a first interconnect structure sandwiched between the first light sensing layer and the second light sensing layer;
a second interconnect structure;
a first logic device between the first light sensing layer and the first interconnect structure;
a second logic device between the second light sensing layer and the second interconnect structure; and
a plurality of dielectric grating patterns sandwiched between the first interconnect structure and the second light sensing layer, wherein the second light sensing layer is between the first logic device and the second logic device, and the plurality of dielectric grating patterns overlap the plurality of second sensing devices.

16. The semiconductor images sensor of claim 15, further comprising a dielectric layer sandwiched between the first interconnect structure and the second light sensing layer, wherein the plurality of dielectric grating patterns is embedded in the dielectric layer.

17. The semiconductor images sensor of claim 16, wherein the dielectric grating patterns and the dielectric layer comprise different dielectric materials.

18. The semiconductor image sensor of claim 15, further comprises:
a plurality of conductive reflectors disposed in the second interconnect structure; and
at least one bonded structure disposed between the first interconnect structure and the second light sensing layer.

19. The semiconductor image sensor of claim 18, further comprising at least one conductor penetrating the second light sensing layer, and the conductor electrically connecting to the bonded structure.

20. The semiconductor image sensor of claim 15, further comprising an optical layer disposed over the first light sensing layer, wherein the optical layer comprises a plurality of color filters, and the plurality of color filters respectively aligned with the plurality of first sensing devices.

* * * * *